United States Patent [19]

Krowne

[11] Patent Number: 4,887,049
[45] Date of Patent: Dec. 12, 1989

[54] SOLID STATE SPACE HARMONIC AMPLIFIER

[75] Inventor: Clifford M. Krowne, Alexandria, Va.

[73] Assignee: The United States of America as represented by the Secretary of the Navy, Washington, D.C.

[21] Appl. No.: 162,701

[22] Filed: Mar. 1, 1988

[51] Int. Cl.[4] .............................................. H03F 3/60
[52] U.S. Cl. ..................................... 330/286; 330/44; 333/246
[58] Field of Search ....................... 330/44, 45, 53, 54, 330/286, 287; 332/25; 315/94; 333/246

[56] References Cited

U.S. PATENT DOCUMENTS 3,913,025 10/1975 Zinn .................................. 330/44 X Primary Examiner—Steven Mottola

[57] ABSTRACT

A fully monolithic solid state device compatible with standard semiconductor processing for amplifying radio frequency (RF) microwave and/or millimeter wave signals is disclosed. The device includes an input microstrip transmission line which capacitively couples an input RF signal to input underlying grating fingers which, in turn, mode-couple the signal to an interaction grating region by way of an input finger taper region. The RF is amplified in the interaction grating region through its interaction with a space charge wave. Then the amplified RF signal is mode-coupled to output underlying grating fingers by way of an output finger taper region before it is capacitively coupled to an output microstrip transmission line.

4 Claims, 3 Drawing Sheets

SOLID STATE SPACE HARMONIC AMPLIFIER

BACKGROUND OF THE INVENTION

Amplifiers and oscillators capable of operating at and above 100 GHz (to approximately 300 GHz) are not available if it is required that they be solid state, fully compatible with monolithic technology, efficient so as to minimize DC dissipation losses, and introduce only small to moderate noise levels into the RF spectrum. Conventional devices which can function at or above 100 GHz as oscillators or reflection amplifiers are IMPATT (and related carrier avalanche devices) and TED or Gunn diodes. IMPATT's, based on impact ionization generation of carriers by carrier collisions with the lattice, are low efficiency (on the order of 10%), high dissipation, devices which are also very noisy because of the collisional scattering behavior. They do, however, operate up to several hundred gigahertz (roughly 300 GHz) depending upon the circuit load, bias conditions, and device structure and material (e.g., Si, Ge, GaAs, InP). TED's, or Gunn diodes, (accumulation, dipole, and LSA modes of operation) are based on the transfer of electrons between two non-equivalent valleys in energy-momentum space. These devices are also low efficiency, high dissipation devices, but exhibit considerably lower noise measure (by 20 dB) than for IMPATT devices and can be realized in III-V periodic table elemental compound combinations. Such binary combinations include GaAs and InP. Other more complex compounds like ternary combinations are also possible, for example. TED's, unfortunately, appear to have a maximum operating frequency of about 150 GHz. Other devices related to the IMPATT, like the TRAPATT and BARITT, suffer from, respectively, low frequency operation (on the order of 10 GHz), and lower power (and efficiency).

Two other classes of devices which have been applied to low frequency or microwave applications (and sometimes millimeter wave frequencies) but which seem to be coming up in maximum operating frequency, are respectively the bipolar transistor and FET device. The bipolar transistor (including the heterojunction type), is a two carrier transport device, minority carrier controlled, and limited to frequencies below about 20 GHz. FET's, the other class of devices which has three terminals, have their behavior based on field effect and majority carrier transport. FET devices include the subgroups JFET's, MISFET's, and MESFET's. The JFET, which controls carrier flow in a channel with a rectifying junction, is a low-frequency device (e.g., using Si or heterojunction semiconductors). MISFET devices (e.g., using Si or GaAs), which rely on channel control using a metal/oxide gate (enhancement and depletion mode of operation), are limited to frequencies under 10 GHz. MESFET's (e.g., using Si, GaAs, or InP), which depend on channel control employing a Schottky/semiconductor barrier gate, appear to be restricted to maximum operating frequencies of 80 GHz (GaAs) or 130 GHz (InP) with low noise production compared to IMPATT's or TED's. Best MESFET results to date have been obtained with state-of-the-art reproducible 0.25 μm gate length devices. HEMT's, high electron mobility MESFET's using heterostructure layers to create 2-dimensional sheets of carriers, do not seem to offer substantial improvements to the ordinary MESFET maximum operating frequency.

Because of the deficiencies of the above-discussed conventional solid state devices for acceptable operation in the millimeter wave frequency regime, some prior art work has been done on alternative structures with distributed electromagnetic circuits interacting with carriers located in a semiconductor. Previously, such distributed structures (which have been fabricated and experimentally tested) have been solid state traveling wave amplifiers (SSTWA's) in analogy to the traveling wave tube (TWTA), with the exception of one device (a solid state grating amplifier or SSGA) which is in the form of a grating introducing spatial harmonics into the physical quantities to obtain amplification. To applicant's knowledge, such SSTWA's used continuous metal microstrip electromagnetic circuit structures which may all have large DC (static) potential and field build-up in localized regions under periodic circuit fingers, possibly severely limiting their operation as amplifiers; such SSTWA's were studied at cooled temperatures; and none of these SSTWA's have displayed any net gain. Recently, efforts have been made to DC isolate the periodic circuit fingers. However, little discernable electronic gain has been realized in doing this.

The above-mentioned solid state grating amplifier (SSGA) is comprised of a microstrip interdigitated finger structure with the fingers all DC isolated from each other, using input and output microstrip feeds. Such an SSGA structure appears to have produced only a small electronic gain.

None of the above-discussed prior art devices has used monolithic semiconductor integrated circuit technology.

OBJECTS OF THE INVENTION

Accordingly, it is an object of the invention to provide a fully monolithic solid state device compatible with standard semiconductor processing for amplifying RF microwave signals.

Another object of the invention is to provide a fully monolithic structure, compatible with silicon semiconductor technology, for developing an amplification of an RF signal using a distributed grating circuit.

Another object of the invention is to provide a solid state space harmonic amplifier device which allows the interaction of an input electromagnetic energy wave with a space charge wave to provide a gain at microwave and/or millimeter wave frequencies.

Another object of the invention is to provide a monolithic solid state device for amplifying millimeter waves in the 100 gigahertz range with low noise.

Another object of the invention is to provide a monolithic, solid-state distributed amplifier which operates on an electromagnetic-electron interaction phenomenon to produce a gain at microwave and/or millimeter wave frequencies.

A further object of the invention is to provide a method for enabling the interaction of an input electromagnetic energy wave with a space charge wave to provide a gain at microwave and/or millimeter wave frequencies.

A still further object of the invention is to provide a method for amplifying a radio frequency signal using a distributed grating circuit.

SUMMARY OF THE INVENTION

These and other objects of this invention are achieved by providing a distributed amplifier device which allows the interaction of an input electromagnetic energy wave with a space charge wave to produce a gain at microwave and/or millimeter wave frequencies. The device includes an input microstrip transmission line which capactively couples an input radio frequency (RF) signal to input underlying grating fingers which, in turn, mode-couple the signal to an interaction grating region by way of an input finger taper region. The RF is amplified in the interaction grating region through its interaction with a space charge wave. Then the amplified RF signal is mode-coupled to output underlying grating fingers by way of an output finger taper region before it is capacitively coupled to an output microstrip transmission line.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein.

DETAILED DESCRIPTION OF THE INVENTION

Structure of Invention

Figure 1:
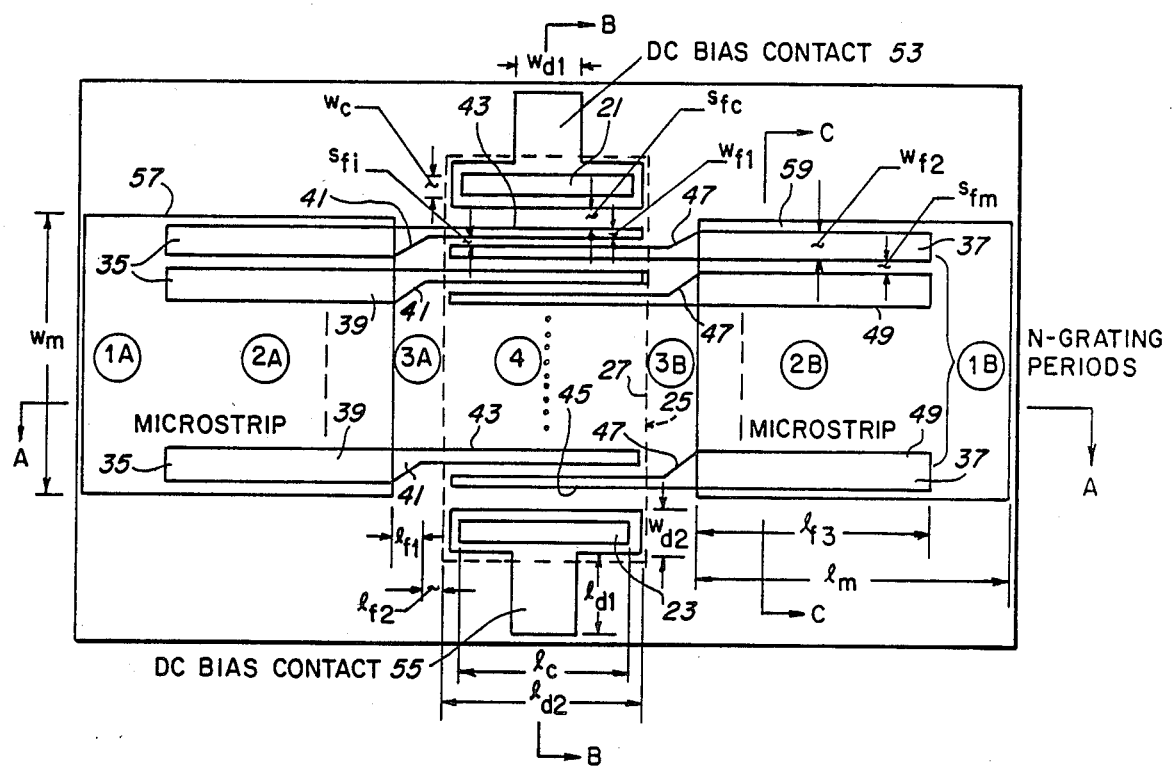
FIG. 1 is a top view of the solid state space harmonic amplifier device of the invention.

In the present invention, a completely monolithic grating amplifier structure, compatible with silicon semiconductor technology, develops amplification of a radio frequency (RF) signal using a distributed grating circuit. Such a structure provides an RF signal gain at microwave and/or millimeter wave frequencies. The fabrication, structure and theory of operation of this completely monolithic grating amplifier, hereinafter referred to as a solid state space harmonic amplifier (SSSHA) structure, will be discussed by now referring to FIGS. 1–4 of the drawings. FIG. 1 is a top view of the SSSHA, while FIGS. 2, 3, and 4 are cross-sectional views of the SSSHA of FIG. 1 through respective section lines A—A, B—B and C—C of FIG. 1.

Figure 2:
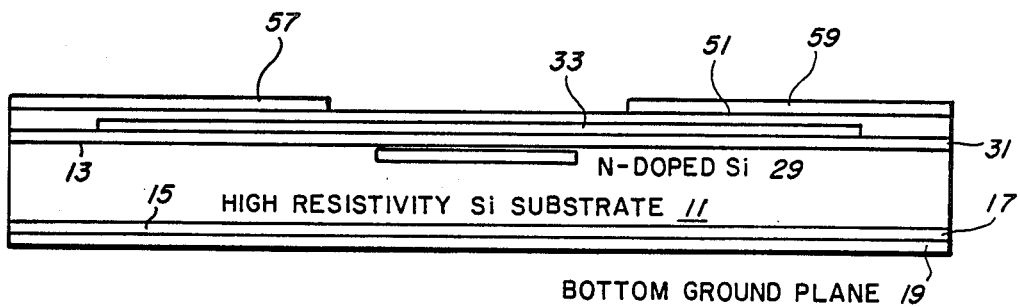
FIG. 2 is a cross-sectional view of the device of FIG. 1 shown through section line A—A along the input RF propagation direction.

The SSSHA is formed on a semiconductor substrate 11 (FIG. 2). This substrate 11 should be thick enough to provide mechanical support and includes a first face 13 and a second face 15. The substrate 11 is an exemplary 254 micron thick layer of high resistivity silicon (Si), having a resistivity of $10^4$ ohm-centimeter or higher and a (111) orientation. Standard microelectronic silicon processing techniques are used to fabricate the SSSHA on the Si substrate 11.

Disposed on the face 15 of the substrate 11 is a 1000 angstrom thick thermal oxide layer 17 of silicon dioxide ($SiO_2$). Layer 17 may be, for example, disposited on face 15 by chemical vapor deposition (CVD) at 405° C. A 5000 angstrom layer of gold is then evaporated or deposited on the $SiO_2$ layer 17 to form a bottom ground plane 19 on that layer 17. The oxide layer 17 ensures that no dc ground return exists from the substrate 11 to the bottom ground plane 19.

Figure 3:
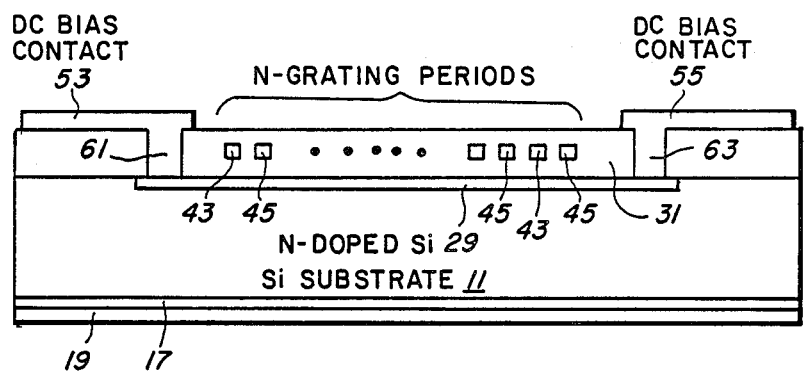
FIG. 3 is a cross-sectional view of the device of FIG. 1 shown along section line B—B through the interaction grating region.
Figure 4:
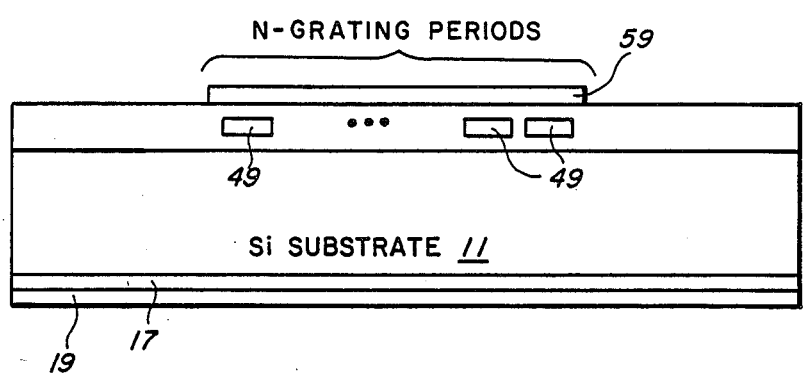
FIG. 4 is a cross-sectional view of the device of FIG. 1 shown along the section line C—C through the output underlying grating finger region.

After the oxide layer 17 and ground plane 19 have been deposited on the substrate 11, the substrate 11 is inverted so that the layers 17 and 19 are at the bottom of FIG. 1 (not shown) and at the bottom of FIGS. 2–4 (as shown). All further semiconductor processing to form the SSSHA of the invention is done from the top portions of FIGS. 1–4, as shown.

As stated before, standard microelectronic Si processing techniques are used to fabricate the SSSHA. Eight steps, including six different mask steps, are used in the fabrication of the SSSHA on top of the face 13.

In the first processing step on top of the face 13, a first mask (not shown) is used to define the portions where phosphorus is to be diffused into the Si face 13 to form n+dc contacts 21 and 23 within an active region 25 designated by dashed line 27 (FIG. 1).

In this first processing step, photoresist (not shown) is put on top of the face 13. Then the first mask is placed on the photoresist. The unmasked portion of photoresist is then exposed to ultra violet (UV) light to weaken the photoresist (and then the first mask is removed). The exposed photoresist is etched away, leaving the pattern for the dc contacts 21 and 23. Phosphorous is then diffused into the pattern to form the dc contacts 21 and 23 shown in FIG. 1. Finally, the remaining photoresist is removed.

In the second processing step, a second mask (not shown) is used to define the area within the dashed line 27 of FIG. 1 where phosphorus-ion implants are to be done at 120 kV and various doses such as $N_I=(0-1)\times 10^{12} cm^2$ to form an n-doped Si region 29 (FIG. 2) which passes through the active region 25.

The second processing step starts from the face 13 that contains the two phosphorus-diffused dc contacts 21 and 23. Photoresist (not shown) is put on the face 13 which contains the dc contacts 21 and 23. The second mask is placed over this photoresist. Then the unmasked portion of photoresist is exposed to UV light. The exposed photoresist is etched away, leaving a hole (not shown) for the desired pattern. The phosphorus-ion implant is done through that hole. Then the remaining photoresist is removed, leaving the phosphorus-ion implant or N-doped Si region 29. This N-doped Si region 29 may be created by diffusion or ion-implantation techniques.

In the third processing step, a third mask (not shown) is used to allow a boron-ion implant over all of the now phosphorus-diffused and phosphorus-ion implanted face 13, except in the active region 25, in order to prevent surface inversion.

In this third processing step, photoresist (not shown) is put on the diffused and implanted face 13. The third mask is placed over this photoresist. The unmasked portion of photoresist is exposed to UV light, before the exposed photoresist is etched away. Then the boron-ion implant is done over all of the diffused and implanted face 13 except in the active region 25. The remaining photoresist is then removed.

In the fourth processing step, about a 1000 angstrom thick thermal oxide layer 31 (FIG. 2) of $SiO_2$ is grown on the previously processed substrate 11 at an annealing temperature of about 900° C. Such annealing of the layer 31 also allows the previously implanted phosphorus and boron ions to be annealed.

In the fifth processing step, a fourth mask (not shown) is used to define a metal finger pattern 33 (FIG. 2) containing input fingers 35 and output fingers 37 (FIG. 1). Each of the input fingers 35 has a wide portion 39 in an input region 2A, a tapered portion 41 in an input region 3A, and a narrow portion 43 in the active or interaction region 25. Similarly, each of the output fingers 37 has a narrow portion 45 in the active or interaction region 25, a tapered portion 47 in output region 3B, and a wide portion 49 in output region 2B. The narrow portions 43 are alternated with the narrow portions 45 in the interaction region 25.

In this fifth processing step, photoresist (not shown) is applied onto the $SiO_2$ layer 31 (FIG. 2). The fourth mask is placed over this photoresist. The unmasked portion of photoresist is exposed to UV light. Then the exposed photoresist is etched away where the metal finger pattern 33 is to be positioned. The patterned photoresist is then covered with a layer of gold (and a thin layer of chromium for adhesion). Then the patterned photoresist is chemically removed, causing lift-off of gold over that photoresist. After the lift-off process, the only gold that remains will be in the metal finger pattern 33 (FIG. 2), which includes the input fingers 35 and output fingers 37 shown in FIG. 1. The thickness of the metal finger pattern is in the range of 0.2 to 0.5 microns.

In the sixth processing step, about a 5000 angstrom thick thermal oxide layer 51 (FIG. 2) of $SiO_2$ is deposited over the entire previously processed substrate 11 by CVD at 405° C. This $SiO_2$ layer 51 covers the metal finger pattern 33 Thus, the metal finger pattern 33 is sandwiched between the two $SiO_2$ layers 31 and 51 for purposes of electrical isolation. The oxide layers 17, 31 and 51 may be grown or deposited and could be SiO or $Si_3N_4$ as well as $SiO_2$.

In the seventh processing step, a fifth mask (not shown) is used to delineate windows or openings 61 and 63 (FIG. 3) to be cut through the $SiO_2$ layers 31 and 51 to the phosphorus-diffused Si portions that form n+ dc contacts 21 and 23 (FIG. 1).

In this seventh processing step, photoresist (not shown) is applied onto the $SiO_2$ layer 51. The fifth mask is then placed over this photoresist. The unmasked portion of photoresist is exposed to UV light. Then the exposed photoresist is etched away to expose the portions where the windows 61 and 63 are to be cut. A suitable chemical etch is applied to these portions in the photoresist to etch away the $SiO_2$ layers 31 and 51 to form the windows or openings 61 and 63 (FIG. 3) down to the phosphorus-diffused Si portions that form the n+ dc contacts 21 and 23 (FIG. 1). Finally, the photoresist is removed.

In the eight processing step a sixth mask (not shown) is used to delineate a second gold metal pattern for dc bias contacts 53 and 55 (FIG. 1), input microstrip line 57 in input regions 1A and 2A, and output microstrip line 59 in output regions 2B and 1B.

In the eighth and final processing step, photoresist (not shown) is applied over the entire previously processed substrate 11 above the $SiO_2$ layer 51. The sixth mask is then placed over this photoresist. The unmasked portion of photoresist is exposed to UV light. Then the exposed photoresist is etched away to expose the portions which are to be metalized with gold. The patterned photoresist is then covered with a layer of gold (and a thin layer of chromium for adhesion). The gold layer fills the windows 61 and 63 (FIG. 3) over contacts 21 and 23 down to the N-doped Si 29, covers the areas within the n+ dc bias contacts 53 and 55, and also produces the input and output microstrip lines 57 and 59, respectively. Then the patterned photoresist is chemically removed, causing lift-off of the gold over that photoresist. After lift-off, the only gold that remains will be in the dc contact windows over contacts 21 and 23, within the areas of the dc bias contacts 53 and 55 and of the microstrip lines 57 and 59. The thickness of the gold layer in the dc bias contacts 53 and 55 and microstrip lines 57 and 59 is in the range of 0.5 to 1.0 microns. The metallization of the SSSHA can be done by vacuum deposition and plating, lift-off, and ion-milling methods, for example. In FIG. 1 the metallization has the following described parameters:

N = number of finger periods $p = 2(w_{f1} + s_{fi}) =$ one finger period distance in region 4

$w_{d1} =$ dc contact input/output line width in region 4

$w_{d2} =$ dc contact metal width over window slot in region 4

$w_{f1} =$ grating metal finger width in region 4

$w_{f2} =$ finger width under microstrip in region 2

$w_c =$ width of dc alloyed-ohmic-contact window to substrate in region 4

$w_m =$ input/output microstrip line width $\geq Np$ in regions 1 and 2

$s_{fc} =$ finger-to-dc contact metal spacing in region 4

$s_{fi} =$ gap between two adjacent fingers in interaction region 4

$s_{fm} =$ gap between two adjacent fingers under input-/output microstrip line in region 2

$l_{f1} =$ finger taper length in region 3

$l_{f2} =$ finger length between taper end and interaction region 4 boundary $l_{f3} =$ finger length under input/output microstrip line in region 2

$l_{d1} =$ length of dc contact input/output line in region $l_{d2} =$ length of dc contact over the ohmic window in region 4

$l_c =$ length of the dc alloyed ohmic contact window in region $4 \leq l_{d2}$ $l_m =$ length of the input/output microstrip line in regions 1 and 2

It should be noted at this time that the SSSHA of the invention is designed to impedance match into a 50 ohm system due to widths of its input and output microstrip transmission lines 57 and 59 over the high resistivity Si substrate 11 (FIG. 1). These widths are about 200 microns (equal to 20 periods of p plus a slight overlap) on the substrate 11.

In the use of a silicon substrate 11 in FIG. 1, with standard processing capabilities being utilized, the above-recited parameters can have the following values: N=20, p=10 microns, $w_{d1}$=50 microns, $w_{d2}$=10 microns, $w_{f1}$=2.5 microns, $w_{f2}$=7.5 microns, $w_c$=5 microns, $w_m$=205 microns, $l_{f1}$=7.5 microns, $l_{f2}$=5 microns, $l_{f3}$=1800 microns, $l_{d1}$=840 microns, $l_{d2}$=200 microns, $l_c$= 195 microns, $l_m$=2500 microns. Gaps between gold metal portions are $S_{fc}$=5 microns, $s_{fi}$=2.5 microns, and $s_{fm}$=2.5 microns.

General Concept of Invention

The SSSHA of FIGS. 1-4, compatible with silicon semiconductor technology, develops amplification of an RF signal using a distributed grating circuit in the interaction region 25. The input RF propagation constant vector $k_{in}$ [the field is proportional to exp (jwt-$jk_{in}$.r)] is parallel to the long direction of the input grating fingers 35 (FIG. 1), so that Fourier space harmonics of the field are created which propagate perpendicular to the input $k_{in}$ vector. These harmonics with propagation constants $k_h$ have $k_h.k_{in}=0$. In FIG. 1, the RF input comes from the microstrip (transmission) line 57 in input region 1A, capacitively couples from microstrip line 57 to the underlying grating fingers 35 in region 2A, and mode couples to the interacting grating region 4 by way of the tapered portions 41 in input region 3A. The output RF energy is extracted by regions similar to those encountered on the input side, namely 3B, 2B and 1B.

FIG. 2 shows a cross section through the finger length direction of fingers 35 and 37 (FIG. 1), which comprise the metal finger pattern 33. Beneath the fingers of finger pattern 33 and separated by an oxide insulating layer 31 is the n-doped Si region 29. Through this region 29 flows a dc current obtained by applying a dc bias voltage $V_b$ (not shown) across dc bias contacts 53 and 55. Electron flow created by this voltage $V_b$, having an average velocity $v_d$, interacts with the RF electromagnetic space harmonics, where $k_h \times k_v = 0$. Here $k_v = w/v_d$, when w = radian frequency. Significant carrier/space harmonic interaction occurs when $k_v \simeq k_h$, where $k_h = 2\pi m/p$, m=order of the spatial harmonic (m=1, 2, 3, ... ), and p=one period distance for the finger portions 43 and 45 in the grating or interaction region 25.

The physical basis of field-carrier interaction is as follows. A circuit grating (finger portions 43 and 45 in the active or interaction region 25) introduces harmonics into the propagating RF electromagnetic field or wave. These harmonics induce perturbations in the original dc electron stream flowing through the n-doped Si region 29, creating a space-charge wave. This space-charge wave, in turn, self-consistently interacts with the propagating electromagnetic wave. When the space-charge wavelength $\lambda_v$ is approximately equal to the RF harmonic wavelength $\lambda_h$ ($\lambda_v \simeq \lambda_h$), considerable energy exchange may occur between the electron stream and the RF harmonic wave. Here $\lambda_v = 2\pi k_v$ and $\lambda_h = 2\pi k_h$. This condition for energy exchange may be thought of in terms of velocity, where it is required that $v_d \simeq v_h$ and $v_d > v_h$, $v_h = pf/n$ (f=w/2$\pi$), for an RF harmonic to extract energy from the electron stream. An infinite superposition of all of the RF harmonics contributes to the overall effect of the grating structure on the output RF wave $k_{out}$ propagating parallel to the fingers 35 and 37, $k_{out} \times k_{in} = 0$.

OPERATION OF THE INVENTION

An input RF electromagnetic energy wave (at a desired frequency within the range of 0.1 to 300 GHz) propagates along the input microstrip transmission line 57 and through input regions 1A and 1B of FIG. 1. Region 1A of the input microstrip line 57 is just on top of the oxide layer 51 (FIG. 2). In Region 2A the input electromagnetic wave overlaps the underlying input grating fingers 35 (FIG. 1) in the metal finger pattern 33 of FIG. 2. As a result, most of the energy in the input electromagnetic wave is capacitively coupled from the microstrip line 57 to the wide portions 39 of the fingers 35 in region 2A. By the time the remaining electromagnetic wave gets to region 3A, nearly all of the electromagnetic energy that is to couple to the fingers 35 has been coupled to the fingers 35. This is due to the fact that the microstrip line 57 terminates at the end of region 2A.

The electromagnetic energy in region 2A mode couples to the interaction grating region or interaction region 25 in region 4 by way of the tapered portions 41 of the fingers 35 in region 3A.

In the interaction region 25 of region 4, the electromagnetic energy is guided by the narrow portions 43 of the input fingers 35 and the narrow portions 45 of the output fingers 37. This movement of the electromagnetic energy along the respective narrow portions 43 and 45 of the fingers 35 and 37 can be readily visualized by referring to FIG. 3, which shows a cross sectional view of FIG. 1 through the interaction grating region 25. Assume that the electromagnetic energy is propagating into FIG. 3. The propagating electromagnetic energy will enter the interaction region 25 by way of the cross section of the narrow portions 43 of input fingers 35 (FIG. 1) and leave the interaction region 25 by way of the cross section of the narrow portions 45 of output fingers 37 (FIG. 1).

In FIG. 3 the windows or openings 61 and 63 contain the gold metal that goes down and makes electrical contact with the n-doped Si region 29. When a dc bias is applied between the dc bias contacts 53 and 55, an electron beam or stream flows through the n-doped Si region 29.

As stated before the electromagnetic energy propagates through regions 1A and 2A of input microstrip 57 and capacitively couples into the underlying fingers in region 2A. If the electromagnetic energy were just propagating in that direction, it would be perpendicular to the flow of electrons through the n-doped Si region 29 and it would be very difficult to get any interation or coupling between the propagating electromagnetic energy and the stream of electrons. To get an interaction between the propagating electromagnetic wave and the electron stream, it is necessary that the electromagnetic wave and the electron stream be co-linear or going in the same direction and that they have approximately equal phase velocities.

Normally in a semiconductor the electrons move much slower than the velocity of an electromagnetic wave. That is, in a semiconductor the electron velocity is no greater than about $10^7$ centimeters per second, whereas in a vacuum electromagnetic energy has a velocity about 3000 times greater than the electron velocity in a semiconductor.

In a dielectric meterial such as Si or $SiO_2$, the velocity of an electromagnetic wave would be slowed down by a factor of about three. However, a velocity reduction by about a factor of about three does not compensate for the fact the electromagnetic wave velocity would still be several orders of magnitude greater than the electron stream velocity As discussed below, the structure of the SSSHA corrects for differences in flow direction and velocity between the electromagnetic wave and the electron stream.

It can be seen in FIG. 3 that the narrow portions 43 and 45 of the respective fingers 35 and 37 are arranged in a periodic fashion and that the periodicity of the fingers is in the same direction as the flow of the electron stream (through the n-doped Si region 29). As shown, this direction is between the left-hand and right-hand sides of FIG. 3. Thus, for example, as the electron stream flows through the n-doped Si region 29 from the left-hand side to the right-hand side of FIG. 3, the narrow portions 43 and 45 of the fingers 35 and 37 also progress from the left-hand side to the right-hand side of FIG. 3.

This progression from left to right of the finger portions 43 and 45 creates spatial harmonics of the electromagnetic wave which go in the same direction as the electron stream. Thus, the first requirement for the exchange of energy from the electron stream to the electromagnetic energy wave is met, since the electron stream and part of the electromagnetic energy flow in the same direction.

The next requirement for energy exchange is that the phase velocities of the electron stream and electromagnetic energy be approximately equal to each other.

The periodicity or repetitiveness of the finger portions 43 and 45 also slows down the electromagnetic energy so that the phase velocity of the electromagnetic energy is approximately equal to the velocity of the electron stream. At this point, when the velocities of the electron stream and electromagnetic wave are similar, an interaction occurs between the electron stream and the electromagnetic wave. For a stronger interaction, the SSSHA should be implemented so that the metal finger portions 43 and 45 are as close as possible to the electron stream flowing through the n-doped Si region 29. However, the finger portions 43 and 45 must not touch the electron stream in the region 29. So the oxide layer 31 is needed to separate the electron stream from the finger portions 43 and 45.

The electromagnetic field produces fringing electric fields between the finger portions 43 and 45. These fringing electric fields point in the same direction as the electron stream, and produce an interaction force which perturbs and acts on the electrons in the electron stream, pushing them back (or forward) and creating a space-charge wave in the electron stream. It is the interaction of the space-charge wave with the electromagnetic wave that causes an energy exchange between the electrons and the electromagnetic wave. Such an energy exchange causes the electromagnetic wave in the finger portions 43 and 45 to gain energy and the electrons to lose some energy.

After the electromagnetic wave gains energy in the interaction region 25 (FIG. 1), it is mode coupled from the interaction grating region 4 to the underlying grating fingers 7 in region 2B by way of the intermemdiate finger taper region 3B, as shown in FIG. 1. The electromagnetic wave is then capacitively coupled from the underlying grating fingers 37 to the output microstrip transmission line 59 for subsequent processing beyond the scope of this invention.

FIG. 4 is a cross-sectional view of the SSSHA device of FIG. 1 shown along the section line C—C through the output underlying grating fingers 37. Note the wide portions 49 of the output fingers 37 and the output microstrip transmission line 59 (which receives the electromagnetic energy) that is capacitively coupled from the finger portions 49.

Figure 5:
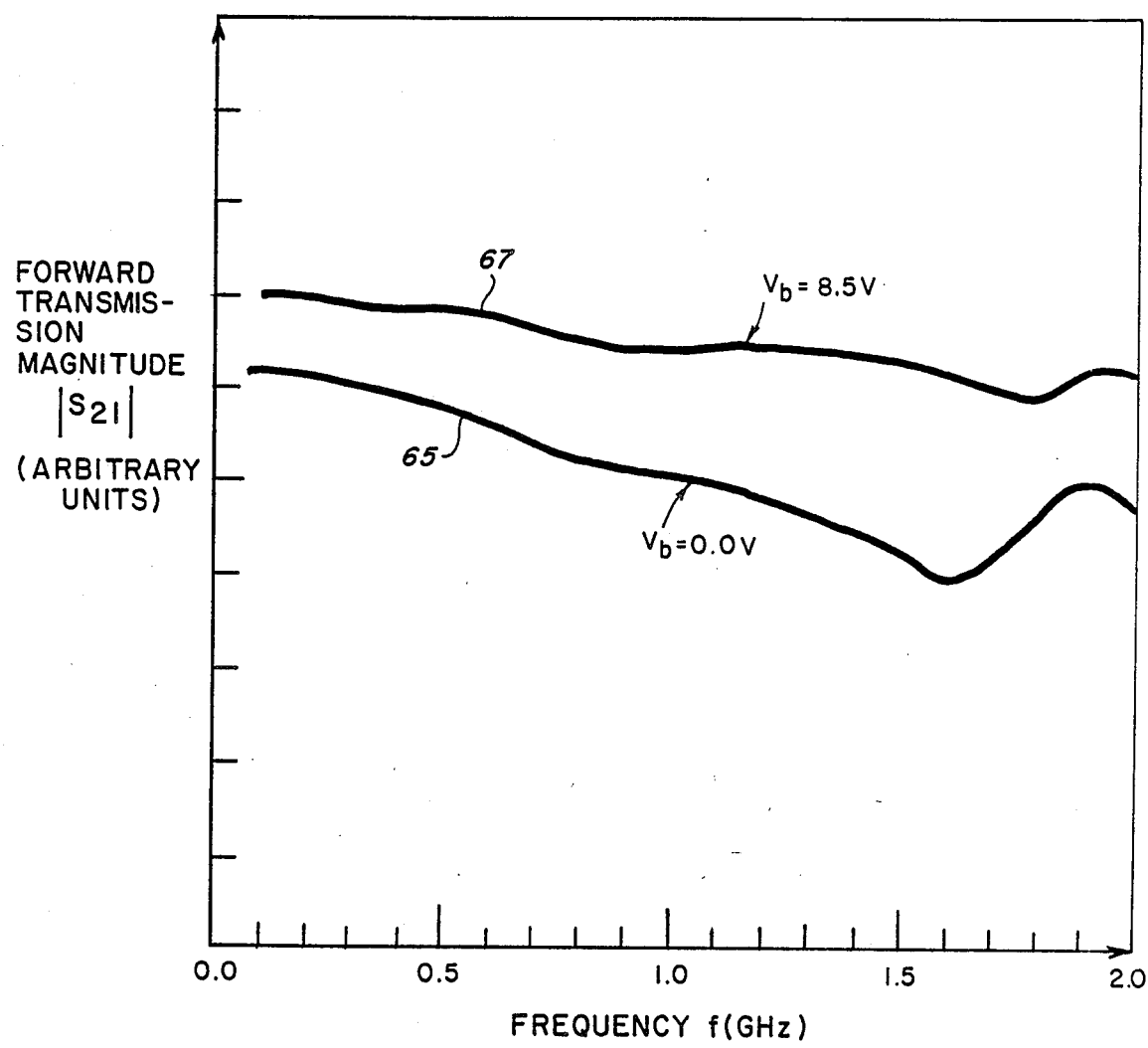
FIG. 5 shows forward transmission magnitude $S_{21}$ versus frequency f curves for two different values of bias voltage $V_b$.

In an exemplary set of waveforms, FIG. 5 plots the forward transmission magnitude $M_{21} = |S_{21}|$ of the electromagnetic wave versus frequency f from 0 to 2 GHz for two different values of bias voltage $V_b$. The bias voltage $V_b$ is the dc voltage that is applied across the dc bias contacts 53 and 55 (FIG. 1). When $V_b = 0.0V$, curve 65 shows the values of $M_{21}$ over the frequency range from 0 to 2 GHz. When $V_b$ is increased to a value of 8.5 V, curve 67 is produced for the values of $M_{21}$ over the 0 to 2 GHz frequency range. Thus, the curves 65 and 67 illustrate the electronic gain (in the values of $M_{21}$) that is achieved when $V_b$ is changed from a value of 0.0V to a value of 8.5V. The difference between the curves 65 and 67 corresponds to an electronic gain of about 1.5 dB/mm. Note that when $V_b = 0.0V$, there is no electron stream flowing through the n-doped Si region 29 (FIG. 3) and hence no interaction with the electromagnetic wave propagating through the fingers in the interaction region 25 (FIG. 1), and therefore no gain.

Figure 6:
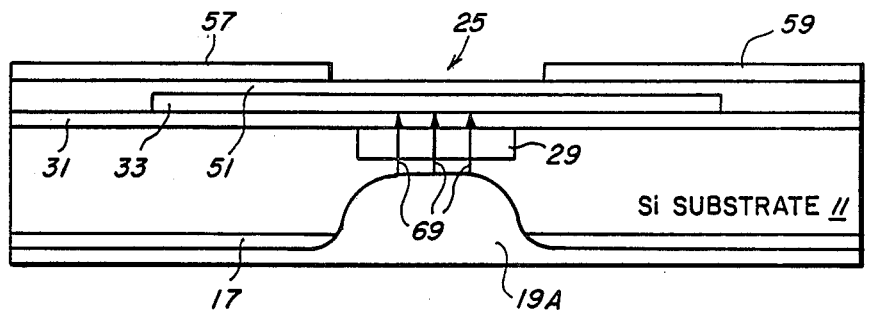
FIG. 6 shows a modification of the device of FIG. 1 by the addition of a via of metal under the interaction grating region shown in FIG. 2.

FIG. 6 is a modification of FIG. 2 showing the creation of a close ground plane or via 19A of metal under the n-doped Si region 29 in the interaction region 25 (FIG. 1). By the addition of a via 19A (usually of gold) the electromagnetic energy (represented by lines 69) is in a very small volume of the interaction region 25. As a result, much of the electromagnetic energy is concentrated in the area of the electron stream. This should produce a higher gain or amplification of the electromagnetic wave.

SHA device design avoids static or dynamic (moving) dipole domain formation, which drops most of the applied dc bias $V_b$ across it instead of over the entire interaction region. This is accomplished by using the indirect bandgap semiconductor Si which has a conduction band minima(s) in the X point region of the brillouin zone (light electrons), and a much higher minima at the L point (heavy electrons). The difference between the X and L point minimas is about a bandgap (1.12 eV at 300° K.) In contrast GaAs has a direct bandgap (1.42 eV at 300° K.) conduction band minima (light electrons) at the point and an only slightly higher minima at the L point (0.31 eV above the lowest minima at 300° K.). The use of GaAs in a "bulk-like" fashion could lead to dipole formation through the negative differential conductivity (NDC) effect based on its bandstructure.

Other semiconductor materials can be utilized if they are employed in such a way so as to avoid dipole domain formation. (Especially a problem, for example, in III–V compound binary, ternary, and quaternary semiconductors.) Use of these semiconductors in their electron saturation velocity regions would allow maximum operation frequencies. Some semiconductors like Si, Ge, and SiC will not encounter the dipole problem due to NDC. However, GaAs, InP, and other compound semiconductors displaying NDC may be candidates if the doped layer is extremely thin in order to completely quench all domain formation. Another alternative is to employ a doped layer consisting of a heterostructure, such as an alternating doped AlGaAs, undoped AlGaAs, undoped GaAs sequence repeated periodically in enough layers to generate the desired surface electron density $N_s$. The heterostructure would be required to totally quench all domain formation.

Therefore, what has been described is a distributed amplifier device which allows the interaction of an input electromagnetic energy wave with a space charge wave to produce a gain at microwave and/or millimeter wave frequencies.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by letters patent of the United States is:

1. A semiconductor device comprising:
   input means for receiving an input RF electromagnetic wave;
   means for enabling an electron, stream to flow through the semiconductor device;
   interaction circuit means displaced from said enabling means in a first direction, said interaction circuit means being responsive to said electromagnetic wave from said input means for allowing an interaction between said electromagnetic wave and said electron stream to amplify said electromagnetic wave; and
   output means for coupling the amplified electromagnetic wave out of said interaction circuit means.

2. The semiconductor device of claim 1 wherein said interaction circuit means includes:
   first and second pluralities of fingers interdigitated with respect to each other and cooperating to allow said electromagnetic wave to interact with said electron stream to amplify said electromagnetic wave.

3. The semiconductor device of claim 2 wherein:
   said input means includes an input microstrip transmission line for receiving said input RF electromagnetic wave, and a plurality of input portions underlying said input microstrip transmission line and respectively coupled to said first plurality of fingers for passing said electromagnetic wave from said input microstrip transmission line to said first plurality of fingers; and
   said output means includes an output microstrip transmission line and a plurality of output portions underlying said output microstrip transmission line, said plurality of output portions underlying said output microstrip transmission line and respectively coupled to said second plurality of fingers for passing amplified electromagnetic wave from said second plurality of fingers to said output microstrip transmission line.

4. A method for amplifying an input RF electromagnetic wave in a smeiconductor device, said method comprising the steps of:
   enabling an electron beam to flow through the semiconductor device;
   allowing an interaction between the electromagnetic wave and the electron stream to amplify the electromagnetic wave; and
   passing the amplified electromagnetic wave out of the semiconductor device.

* * * * *